United States Patent
Shibuya et al.

[11] Patent Number: 6,140,928
[45] Date of Patent: Oct. 31, 2000

[54] REMAINING BATTERY CAPACITY MEASURING DEVICE

[75] Inventors: Nobuo Shibuya, Hiratsuka; Hideki Miyamoto, Yokohama; Hirotaka Sakai, Kawasaki; Makoto Tsuchihata, Yokohama, all of Japan

[73] Assignee: Toshiba Battery Co., Ltd., Tokyo, Japan

[21] Appl. No.: 09/181,812

[22] Filed: Oct. 29, 1998

[30] Foreign Application Priority Data

| Oct. 31, 1997 | [JP] | Japan | 9-300797 |
| Oct. 31, 1997 | [JP] | Japan | 9-300798 |
| Oct. 31, 1997 | [JP] | Japan | 9-300799 |
| Oct. 31, 1997 | [JP] | Japan | 9-300800 |

[51] Int. Cl.$^7$ .................................................. G08B 21/00
[52] U.S. Cl. ..................... 340/636; 324/426; 320/134; 320/156
[58] Field of Search ........................ 340/636; 324/426, 324/433; 320/134, 156

[56] References Cited

U.S. PATENT DOCUMENTS

| 4,333,149 | 6/1982 | Taylor et al. ............................... 702/63 |
| 4,931,737 | 6/1990 | Hishiki ...................................... 324/431 |
| 5,493,197 | 2/1996 | Eguchi et al. .............................. 320/5 |

FOREIGN PATENT DOCUMENTS

0588613 A2  3/1994  European Pat. Off. .

OTHER PUBLICATIONS

Patent Abstracts of Japan, vol. 017, No. 157, Mar. 26, 1993, p. 1511—Abstract for JP 04–323580 A, published Nov. 12, 1992; Miyauchi Yoshikatsu (Matsushita Electric Works Ltd.).

Patent Abstracts of Japan, vol. 016, No. 143, Apr. 9, 1992. p. 1335—Abstract for JP 04–001581 A, published Jan. 7, 1992, Kimura Yoshiji (Seiko Epson Corp.).

*Primary Examiner*—Edward Lefkowitz

[57] ABSTRACT

A remaining battery capacity measuring device having a microprocessor and an integrated circuit is packaged together with a secondary battery to form a battery pack. The integrated circuit includes a current measuring circuit for charging and discharging currents of a secondary battery, an overcurrent detection circuit for detecting overcurrent in the secondary battery, a driver circuit for driving a semiconductor switch for change and discharge control of the secondary battery, and a power switch circuit for power-saving operation. The current measuring circuit includes an operational amplifier for detecting a voltage across a resistor for current detection, and has a function to apply a variable offset voltage to the amplifier and a function to vary the gain of another operational amplifier for amplifying the output of the former operational amplifier. The current measuring circuit detects the voltage across the resistor independently of the overcurrent detection circuit, and enjoys high measurement accuracy. The overcurrent detection level and overcurrent detection response time of the overcurrent detection circuit can be externally set by an external divider circuit and an external variable capacitor. The power switch circuit selectively connects various circuit sections of the battery capacity measuring device to a power source, depending on the operating state, charging or discharging, of the secondary battery.

47 Claims, 7 Drawing Sheets

FIG. 6

| PS3 | CHG 1 | CHG 2 | DC1 | |
|---|---|---|---|---|
| 0 | 0 | 0 | 0 | - |
| 0 | 0 | 1 | 0 | SW24,SW26 |
| 0 | 1 | 0 | 0 | SW24,SW26 |
| 0 | 1 | 1 | 0 | SW24,SW26 |
| 0 | 0 | 0 | 1 | SW25,SW26 |
| 0 | 0 | 1 | 1 | SW24,SW25,SW26 |
| 0 | 1 | 0 | 1 | SW24,SW25,SW26 |
| 0 | 1 | 1 | 1 | SW24,SW25,SW26 |
| 1 | 0 | 0 | 0 | - |
| 1 | 0 | 1 | 0 | SW25,SW26 |
| 1 | 1 | 0 | 0 | SW25,SW26 |
| 1 | 1 | 1 | 0 | SW25,SW26 |
| 1 | 0 | 0 | 1 | SW24,SW26 |
| 1 | 0 | 1 | 1 | SW24,SW25,SW26 |
| 1 | 1 | 0 | 1 | SW24,SW25,SW26 |
| 1 | 1 | 1 | 1 | SW24,SW25,SW26 |

REMAINING BATTERY CAPACITY MEASURING DEVICE

BACKGROUND OF THE INVENTION

1. Field of the Invention

The present invention relates to a remaining battery capacity measuring device, and more particularly, to a remaining battery capacity measuring device which is capable of measuring the remaining capacity of a secondary battery with high accuracy and which is suited to be packaged together with the secondary battery.

2. Description of the Related Art

Chargeable secondary batteries, such as nickel-hydrogen storage batteries, lithium ion batteries, etc., have recently spread to a marked degree, and are now widely used as power sources for various electronic apparatuses including personal computers. These days, moreover, various attempts are made to develop so-called battery packs in which a secondary battery is packaged together with protection circuits for the secondary battery and a measuring device for measuring the remaining battery capacity.

The remaining battery capacity measuring device generally comprises a current measuring circuit for measuring charging and discharging currents flowing through the secondary battery on the basis of a voltage across a shunt resistor for current detection that is connected in series with the secondary battery. The remaining battery capacity is determined by a microprocessor which cumulates the charging and discharging currents that are detected by the current measuring circuit. The current measuring circuit of the battery capacity measuring device is required to detect the charging and discharging currents of the secondary battery with high accuracy. Further, the battery capacity measuring device including the current measuring circuit and operated by electric power supplied from the secondary battery is required to minimize its power consumption.

However, the conventional current measuring circuit comprised of discrete circuit components is relatively high in power consumption. Further, improving the current measurement accuracy of the current measuring circuit makes the configuration of the circuit complicated. It is very difficult, therefore, to package the battery capacity measuring device, including the current measuring circuit, together with the secondary battery to form a battery pack.

Conventionally, current fuses and the like are used for the protection of the secondary battery against overcurrent. However, the current level for the fusing of the current fuses is insecure, and besides, the fusing time varies depending on the current value. Therefore, some current fuses cannot ensure a reliable protective measure against overcurrent. In this regards, the current fuses may be replaced with an electronic overcurrent detection circuit that performs protective operation against overcurrent when it detects overcurrent in the secondary battery, to thereby protect the secondary battery and electronic devices driven by the battery.

However, the overcurrent detection circuit has a complicated circuit configuration and uses discrete components, so that its power consumption is relatively high. Possibly, this detection circuit may be designed to detect overcurrent in accordance with the output of the current measuring circuit. In this case, however, the measurement accuracy of the current measuring circuit lowers. More specifically, if the overcurrent detection circuit is so constructed as to detect overcurrent in accordance with a current value that is detected by the current measuring circuit, the dynamic range of the measuring circuit must be made wide enough to detect both normal and excessive charging and discharging currents. Thus, not only the detection accuracy of the current measuring circuit but also the overcurrent measurement accuracy thereof are lowered. In the case where the current measuring circuit and the overcurrent detection circuit are configured independently of each other, the circuit configuration is too large-scaled.

As mentioned before, the conventional current measuring circuit and overcurrent detection circuit are comprised of discrete circuit components, and their power consumption is relatively high. If these circuits are incorporated together with the secondary battery in a battery pack, therefore, the battery pack is large-sized, and the limited capacity of the secondary battery is consumed unusefully.

The performance (capacity characteristics) of the secondary battery is very susceptible to temperature, and yet, the battery pack has no substantial room for a heat radiating mechanism or the like. In packaging the battery capacity measuring device together with the secondary battery to realize the battery pack, therefore, heat generation from the measuring device must be minimized.

Since the conventional remaining battery capacity measuring device, comprised of discrete circuit components, consumes high power, it is extremely difficult to realize a battery pack that fulfills the requirement for the reduction of the heat generation. Even though the battery capacity measuring device may be designed to meet certain working conditions of a battery pack and incorporated together with the secondary battery in the battery pack, the measuring device sometimes may fail to operate properly if the working conditions of the battery pack vary. Thus, it is hard to provide a remaining battery capacity measuring device that conforms to various battery pack working conditions.

SUMMARY OF THE INVENTION

An object of the present invention is to provide a remaining battery capacity measuring device with a power saving current measuring circuit, capable of measuring charging and discharging currents of a secondary battery with high accuracy.

Another object of the invention is to provide a remaining battery capacity measuring device with a power saving overcurrent detection circuit, capable of detecting overcurrent in a secondary battery easily and securely.

Still another object of the invention is to provide a remaining battery capacity measuring device with an overcurrent detection circuit, capable of easily varying its overcurrent detection level and overcurrent detection response time so as to fit the specifications and intended use of a secondary battery, to thereby permit the device to have general versatility.

A further object of the invention is to provide a remaining battery capacity measuring device capable of avoiding waste of power consumption, thereby ensuring power-saving operation.

Another object of the invention is to provide a remaining battery capacity measuring device which is suited to be packaged together with a secondary battery.

A remaining battery capacity measuring device according to an aspect of the present invention comprises a current measuring circuit for measuring charging and discharging currents of a secondary battery. The current measuring circuit includes a differential amplifier circuit for detecting a voltage across a resistor for current detection connected in series with the secondary battery, an offset voltage regulator circuit for selectively applying an offset voltage to the differential amplifier circuit and for variably setting the offset voltage, and a gain adjusting circuit for variably setting the gain of the differential amplifier circuit.

According to the remaining battery capacity measuring device described above, measurement errors of the current measuring circuit can be effectively compensated to improve the measurement accuracy of the circuit by adjusting an offset voltage applied to the differential amplifier circuit and the gain of the amplifier circuit.

Preferably, the current measuring circuit further includes a polarity inversion switch circuit interposed between the resistor and the differential amplifier circuit. The polarity inversion switch circuit changes the input polarity of the voltage across the resistor in which polarity the voltage is input to the differential amplifier circuit. The differential amplifier circuit is driven by a single power source. The polarity inversion switch circuit takes a first shift position when the secondary battery is charged and takes a second shift position when the secondary battery is discharged, the input polarity in the second shift position being opposite to that in the first shift position.

In the remaining battery capacity measuring device having this preferred current measuring circuit, the voltage across the resistor is applied through the polarity inversion switch circuit to the differential amplifier circuit with the same polarity irrespective of the operating state, charging or discharging, of the secondary battery. Thus, the charging and discharging currents can be measured even by means of the differential amplifier circuit that is driven by the single power source and operable within a limited operational or polarity range. This current measuring circuit, compared with one in which the differential amplifier circuit is driven by positive and negative power sources, makes it possible to simplify the constructions of the driving power source and the differential amplifier circuit and reduce the power consumption of the differential amplifier circuit. The current measuring circuit thus constructed is suited to be configured in the form of an integrated circuit. The battery capacity measuring device, having the current measuring circuit configured in an integrated circuit form, is suited to be packaged together with the secondary battery.

A remaining battery capacity measuring device according to another aspect of the invention comprises a current measuring circuit for detecting a voltage across a resistor for current detection connected in series with a secondary battery and for measuring charging and discharging currents of the secondary battery in accordance with the voltage across the resistor, and an overcurrent detection circuit for detecting the voltage across the resistor independently of the current measuring circuit and for detecting overcurrent in the secondary battery in accordance with the detected voltage across the resistor.

According to the remaining battery capacity measuring device described above, the dynamic range of the current measuring circuit can be settled depending on the normal or steady-state levels of the charging and discharging currents, and the dynamic range of the overcurrent detection circuit can be set so as to be suitable for the detection of overcurrent, independently of the dynamic range of the current measuring circuit. Thus, the generation of overcurrent in the secondary battery can be securely detected, while an ordinary charging or discharging current of the secondary battery is measured with high accuracy for the measurement of the remaining battery capacity.

Preferably, each of the current measuring circuit and the overcurrent detection circuit has an input stage which is comprised of a differential amplifier with high input impedance. According to this preferred arrangement, the power consumption in the current measuring circuit and the overcurrent detection circuit can be restrained, so that these circuits are suited to be configured in the form of an integrated circuit.

More preferably, the current measuring circuit and the overcurrent detection circuit are configured in an integrated circuit form. According to this preferred arrangement, compared with the case where discrete circuit components are used, the power consumption and the circuit size can be reduced, and variations in the accuracy of manufacture of the circuit components can be reduced to improve the accuracy of detection of the charging and discharging currents and overcurrent. The remaining battery capacity measuring device, having the current measuring circuit and the overcurrent detection circuit configured in the form of an integrated circuit, is suited to be packaged together with the secondary battery.

A remaining battery capacity measuring device according to still another aspect of the invention comprises an overcurrent detection circuit for detecting overcurrent in the secondary battery. The overcurrent detection circuit includes a differential amplifier for detecting a voltage across a resistor for current detection connected in series with the secondary battery, a comparator for comparing an externally set reference value with the output of the differential amplifier and for outputting an output signal indicative of the generation of overcurrent when the reference value is exceeded by the output of the differential amplifier, and a timer circuit for starting time measurement in response to the output signal of the comparator and for outputting an overcurrent detection signal when an externally set time is over.

According to the remaining battery capacity measuring device described above, the reference value for the differential amplifier of the overcurrent detection circuit and the set time for the timer circuit can be externally set to be fit for the specifications, properties, and intended use of the secondary battery, so that a protective measure can be taken against overcurrent, depending on the specifications and the like of the secondary battery. Since the operating characteristics of the overcurrent detection circuit can be externally set in this manner, the versatility of the overcurrent protection function of the remaining battery capacity measuring device cannot be ruined even in the case where the overcurrent detection circuit is configured in the form of an integrated circuit. In other words, the overcurrent detection circuit is suited to be configured in an integrated circuit form.

Preferably, the overcurrent detection circuit includes first and second differential amplifiers each driven by a single power source. Each of the first and second differential amplifiers is connected with the opposite ends of the resistor so as to input the voltage across the resistor in polarity which is different between the first and second differential amplifiers.

In the remaining battery capacity measuring device having this preferred overcurrent detection circuit, the voltage across the resistor is applied, in different polarity, to the first and second differential amplifiers. In other words, even in the case where each of the first and second differential amplifiers is driven by a single power source and has a limited operative range, either an excessive charging or discharging current of the secondary battery can be detected by the first differential amplifier and another excessive current can be detected by the second differential amplifier. Since each differential amplifier is driven by means of a single power source, the construction of the power source for each differential amplifier is simple, and the overcurrent detection circuit is suited to be configured in an integrated circuit form.

More preferably, a corresponding one of the first and second differential amplifiers is driven depending on whether the secondary battery is charged or discharged. According to this preferred overcurrent detection circuit, power-saving operation can be enjoyed by selectively operating the first or second differential amplifier depending on the operating state, charging or discharging, of the secondary battery. Thus, the overcurrent detection circuit can be more suitable for the configuration in the form of an integrated circuit.

Preferably, the timer circuit includes a switch circuit responsive to the output signal of the comparator, a constant-current source connected through the switch circuit to a capacitor, externally attached to the overcurrent detection circuit, for charging the capacitor, and an auxiliary comparator for comparing a charging voltage to which the capacitor is charged with a reference voltage and for outputting the overcurrent detection signal when the reference voltage is exceeded by the charging voltage of the capacitor. More preferably, the capacitor is a variable capacitor. According to these preferred overcurrent detection circuits, the set time for the timer circuit can be easily changed by replacing the external capacitor or adjusting the capacity of the variable capacitor.

A remaining battery capacity measuring device according to a further aspect of the invention comprises a current detection circuit including first and second differential amplifiers each connected to the opposite ends of the resistor for current detection, connected in series with the secondary battery, so as to input the voltage across the resistor in polarity different between the first and second differential amplifies and each operable to detect an electric current flowing through the secondary battery based on the voltage across the resistor, and a power switch circuit for selectively connecting the first or second differential amplifier to a power source, depending on the direction of the electric current flowing through the secondary battery.

According to the remaining battery capacity measuring device described above, power-saving operation can be enjoyed by selectively supplying electric power to either the first or second differential amplifier, depending on the direction of the current flowing through the secondary battery, thereby avoiding waste of power consumption in the other differential amplifier that is not practically operating.

Preferably, the current detection circuit is a current measuring circuit for detecting the charging and discharging currents of the secondary battery in accordance with the voltage across the resistor for current detection, and a corresponding one of the first and second differential amplifiers is connected to the power source through the power switch circuit, depending on whether the secondary battery is charged or discharged. According to this preferred arrangement, the power consumption in the current measuring circuit can be reduced as the charging or discharging current of the secondary battery is detected.

Preferably, the current detection circuit is an overcurrent detection circuit for detecting overcurrent in the secondary battery in accordance with the voltage across the resistor for current detection.

More preferably, the current detection circuit constituting the overcurrent detection circuit further includes a first comparator for comparing the output of the first differential amplifier with a first reference value and for outputting a first discrimination output when the first reference value is exceeded by the output of the first differential amplifier, and a second comparator for comparing the output of the second differential amplifier with a second reference value and for outputting a second discrimination output when the second reference value is exceeded by the output of the second differential amplifier. The power switch circuit connects a corresponding one of the first and second comparators to the power source, depending on the differential amplifier, first or second, connected to the power source through the power switch circuit.

More preferably, the current detection circuit constituting the overcurrent detection circuit further includes a first overcurrent detector for detecting overcurrent in accordance with the first discrimination output from the first comparator and a second overcurrent detector for detecting overcurrent in accordance with the second discrimination output from the second comparator. The power switch circuit connects the first overcurrent detector to the power source when the first discrimination output is delivered and connects the second overcurrent detector to the power source when the second discrimination output is delivered.

According to these preferred arrangements, the power consumption in the overcurrent detection circuit can be reduced as the generation of excessive charging and discharging currents in the secondary battery is detected. This power-saving current detection circuit is suitable to be configured in the form of an integrated circuit. The remaining battery capacity measuring device including the current detection circuit formed into an integrated circuit is suitable for the realization of a battery pack.

BRIEF DESCRIPTION OF THE DRAWINGS

FIG. 6 is a diagram illustrating, by way of example, a control table partially used for switch control of a control logic section of the power switch circuit.

DETAILED DESCRIPTION OF THE INVENTION

A remaining battery capacity measuring device according to one embodiment of the present invention will now be described with reference to the accompanying drawings.

Figure 1:
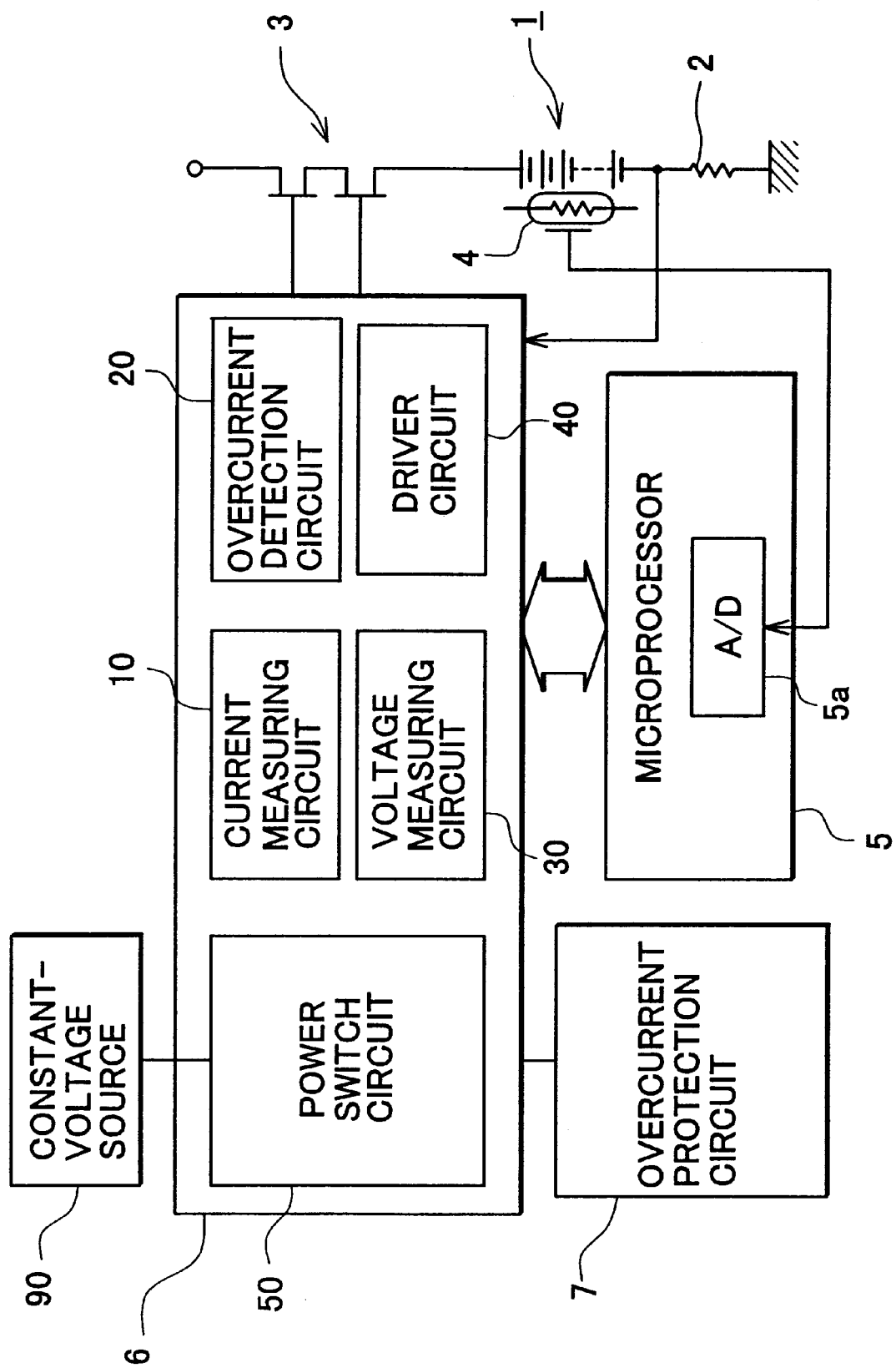
FIG. 1 is a diagram showing a battery pack with a remaining battery capacity measuring device according to one embodiment of the present invention.

The battery capacity measuring device according to the present embodiment comprises a microprocessor 5 having an A/D converter 5a therein, and an integrated circuit (IC) 6 for measuring the remaining battery capacity by cumulating, in the microprocessor 5, charging and discharging currents represented by a voltage across a shunt resistor 2. As shown in FIG. 1, the battery capacity measuring device constitutes a battery pack in conjunction with a secondary battery 1, shunt resistor 2, second switch 3, temperature sensor 4, overvoltage protection circuit 7 for the secondary battery, and constant-voltage source 90. The battery pack has positive and negative terminals to which a charger or load (not shown) is connected selectively.

The secondary battery 1, which may be formed of a single cell, generally comprises a set of cells that are connected in series or in parallel with one another or in serial-parallel relation. The positive terminal of the secondary battery 1 is connected to the positive terminal of the battery pack through the semiconductor switch 3, while the negative terminal of the battery 1 is connected to the negative terminal of the battery pack through the shunt resistor 2. In other words, the resistor 2 is connected in series with the secondary battery 1.

The semiconductor switch 3 includes a charge FET 3a and a discharge FET 3b. If the charge FET 3a is turned on with the charger connected to the battery pack, charging current from the charger flows into the secondary battery 1 through a channel in the FET 3a and a parasitic diode (not shown) of the discharge FET 3b. If the discharge FET 3b is turned on with the load connected to the battery pack, on the other hand, discharging current from the secondary battery 1 flows into the load through a channel in the FET 3b and a parasitic diode (not shown) of the charge FET 3a.

Since the capacity characteristic of the secondary battery 1 depends on the battery temperature, the microprocessor 5, in measuring the remaining battery capacity, receives through the A/D converter 5a temperature information detected by the temperature sensor 4 and indicative of the temperature of the battery 1, and uses this temperature information as correction data. The IC 6 and the overvoltage protection circuit 7 may be configured in an integrated circuit form. According to the present embodiment, however, the protection circuit 7 is formed as a circuit unit separate from the IC 6, in consideration of the difference in operating voltage between the two elements.

Figure 2:
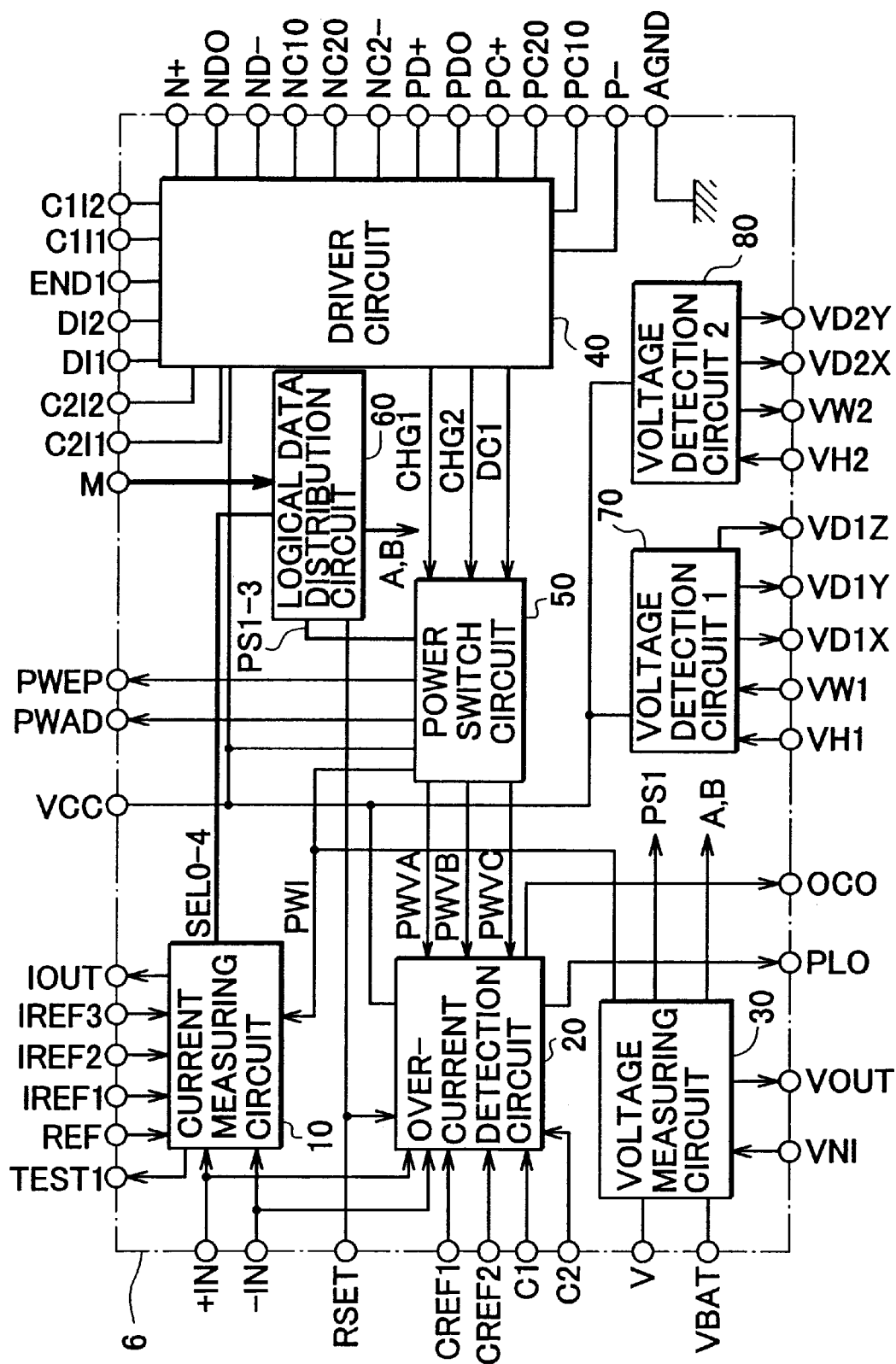
FIG. 2 is a schematic block diagram showing an integrated circuit constituting the primary part of the remaining battery capacity measuring device shown in FIG. 1.

As shown in FIGS. 1 and 2, the IC 6 comprises a current measuring circuit 10 for measuring the charging and discharging currents of the secondary battery 1, an overcurrent detection circuit 20 for generating an overcurrent detection output when overcurrent flows through the battery 1, a voltage measuring circuit 30 for measuring the voltage across the secondary battery 1 and the voltage across each battery cell of the secondary battery, a driver circuit 40 for driving the semiconductor switch 3, and a power switch circuit 50 for power-saving operation.

In this arrangement, the current measuring circuit 10 measures the voltage across the shunt resistor 2 that varies depending on the charging or discharging current flowing through the secondary battery 1, and applies an analog measurement output indicative of the charging or discharging current to the microprocessor 5 via the A/D converter 5a. The overcurrent detection circuit 20 applies a digital detection output indicative of the generation of overcurrent to the microprocessor 5 when it detects overcurrent from the voltage across the resistor 2. The voltage measuring circuit 30 measures the voltage across the secondary battery 1 and the voltage across each battery cell, and applies analog measurement outputs indicative of the measured voltages to the microprocessor 5 through the A/D converter 5a. The driver circuit 40, which operates under the control of the microprocessor 5, controls the operation of the semiconductor switch 3, thereby controlling charge and discharge of the battery 1. The driver circuit 40 is designed to be compatible with semiconductor switches of various configurations that can be realized by using p- and n-channel FETs and the like.

Further, the IC 6 comprises a logical data distribution circuit 60 and two voltage detection circuits 70 and 80. The distribution circuit 60 distributes control data from the microprocessor 5 to current measuring circuit 10, power switch circuit 50, and voltage measuring circuit 30. The voltage detection circuits 70 and 80 detect the voltages of peripheral circuits and apply digital detection outputs corresponding to the detected voltages to the microprocessor 5.

Preferably, in the remaining battery capacity measuring device, the charge FET 3a includes a quick-charge FET (not shown) and a trickle-charge FET (not shown) connected in parallel with each other. The respective drain electrodes of these FETs are connected to a charger connecting terminal (not shown), while the source electrodes thereof are connected through a diode to the positive terminal of the battery cell array constituting the secondary battery. The drain electrode of the discharge FET 3b is connected to a load connecting terminal (not shown), while the source electrode thereof is connected to the junction between the diode and the positive terminal of the battery cell array. The negative terminal of the cell array is connected to the negative terminal of the battery pack.

In the preferred arrangement described above, the IC 6 is connected with the various input and output terminals, as shown in FIG. 2. The IC 6 is connected to the secondary battery 1, shunt resistor 2, semiconductor switch 3, and microprocessor 5 through these terminals. The following is a description of the principal input and output terminals of the IC 6.

The IC 6 has a power supply terminal VCC connected to the constant-voltage source 90 (FIG. 1), which uses the secondary battery 1 as its operating power supply. Electric power from the constant-voltage source 90 is supplied, via the power supply terminal VCC, to the overcurrent detection circuit 20, driver circuit 40, power switch circuit 50, and two voltage detection circuits 70 and 80. In association with the driver circuit 40, the IC 6 has terminals PD+ and P− connected to the positive and negative terminals, respectively, of the cell array, terminal PC+ connected to the charger connecting terminal (not shown) of the battery pack, and terminals PD0, PC20 and PC10, which are connected to the gate electrodes of the discharge FET, trickle-charge FET, and quick-charge FET, respectively. Further, the IC 6 is provided with a gate voltage control signal input terminal ENDI, gate voltage cutoff command input terminals C1I2, DI2 and C2I2 connected to an overcurrent detection signal output terminal OCO that is associated with the overcurrent detection circuit 20, and gate voltage cutoff command input terminals C1I1, DI1 and C2I1 connected to the microprocessor 5.

When the connection of the charger or load to the battery pack is detected based on voltages that appear at, for example, the terminals PC+ and PD+, in the battery capacity measuring device of the preferred embodiment, a gate voltage control signal from the microprocessor 5 is supplied to the driver circuit 40 through the terminal ENDI. Thereupon, the driver circuit 40 controls the respective gate voltages of the trickle-charge FET, quick-charge FET, and discharge FET, thereby turning on a corresponding one of the FETs. In consequence, the charging current from the charger flows through the battery cell array, or discharging current from the cell array flows through the load. As this is done, the charging or discharging current flowing through the shunt resistor 2 is measured by means of the current measuring circuit 10 that is connected to shunt resistor voltage input terminals +IN and −IN of the IC 6. The measured current is supplied to the microprocessor 5 through a terminal IOUT of the IC 6. In response to this measured current, the microprocessor 5 adjusts the gate voltage control signal supplied to the driver circuit 40 through the terminal ENDI, thereby controlling the charging or discharging current.

If the generation of overcurrent is detected by the overcurrent detection circuit 20 connected to the terminals +IN and −IN of the IC 6, an overcurrent detection output is supplied to the driver circuit 40 via the terminals OCO, C1I2, DI2 and C2I2. Thereupon, the driver circuit 40 turns off the trickle-charge, quick-charge, and discharge FETs. If another overcurrent detection output is delivered to the microprocessor 5 through a terminal PLO of the IC 6 after the detection of overcurrent, a FET cutoff command from the microprocessor 5 is supplied to the driver circuit 40 via the terminals C1I1, DI1 and C2I1, whereupon the FETs are turned off.

Other input and output terminals of the IC 6 will be described later with reference to FIGS. 3 to 5. However, a description of those terminals which are not associated directly with the present invention is omitted.

Figure 3:
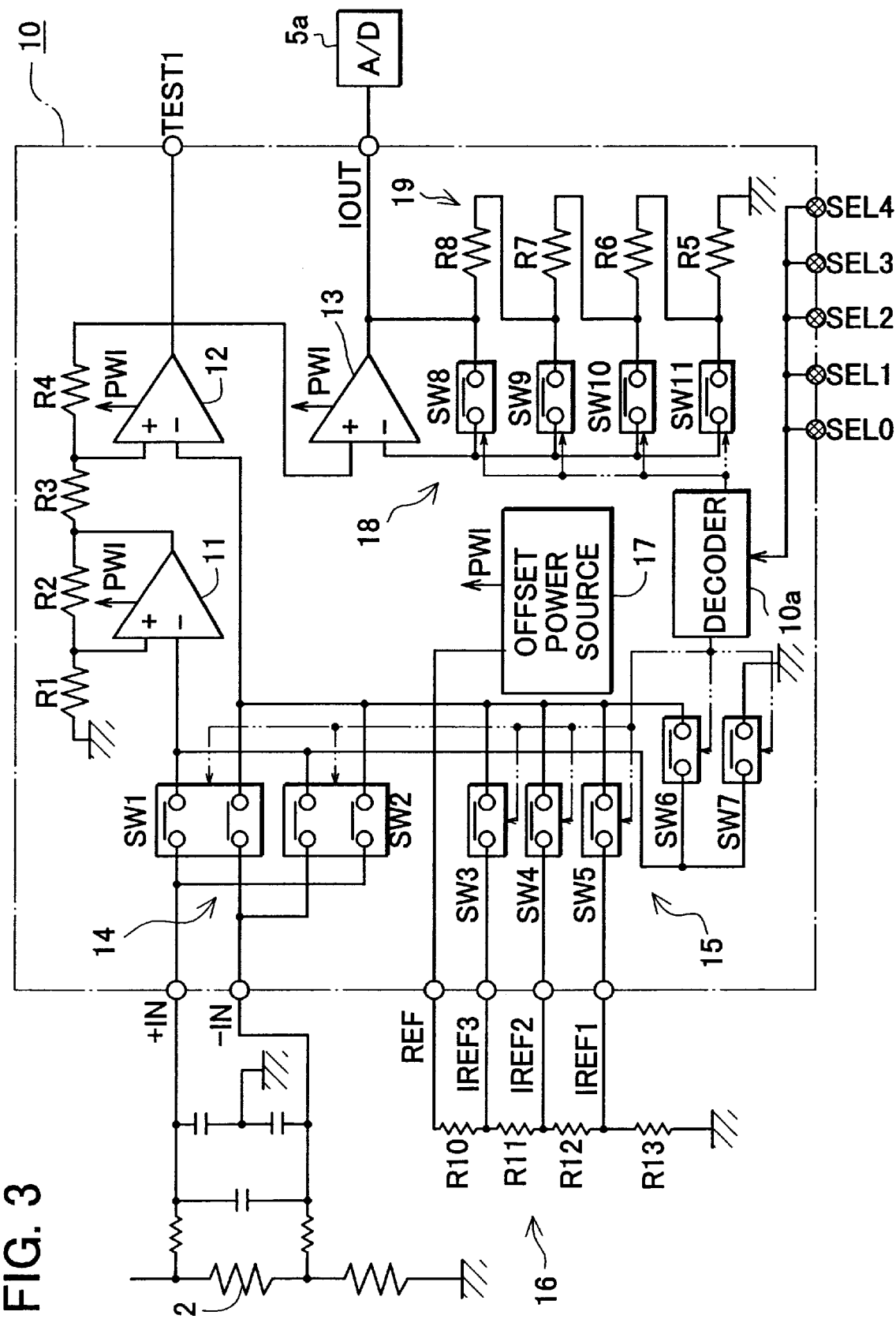
FIG. 3 is a diagram showing an exemplary configuration of a current measuring circuit shown in FIG. 2.

Referring now to FIG. 3, the current measuring circuit 10 will be described further in detail.

The current measuring circuit 10 is provided with logical data input terminals SEL0 to SEL4, polarity inversion switch means 14 including two switches SW1 and SW2, and first, second, and third operational amplifiers 11, 12 and 13 with high input impedance each of which is driven by a single power source (single polarity power sources) corresponding to symbol PWI.

The current measuring circuit 10 selectively turns on one of the switches SW1 and SW2 of the polarity inversion switch means 14, depending on the operating state, charging or discharging, of the secondary battery 1, and applies a variable offset voltage to the operational amplifier 12, thereby variably setting the gain of the operational amplifier 13, as will be described in detail later. In association with the abovementioned feature, the logical data distribution circuit 60 decodes multi-bit control data supplied from the microprocessor 5 through a control data input terminal M of the IC 6, thereby generating multi-bit logical data, and supplies some of these logical data, that is, those logical data which represent the charging and discharging states of the secondary battery 1, offset condition, and gain condition, to a decoder 10a of the current measuring circuit 10 through the terminals SEL0 to SEL4. The decoder 10a decodes these logical data and outputs driving signals for the switches SW1 and SW2 and other switches which will be mentioned later.

As shown in FIG. 3, the first shunt resistor voltage input terminal +IN of the IC 6 is connected, on the one hand, to one end of the shunt resistor 2 through a resistor. On the other hand, the terminal +IN is connected to the noninverting input terminal of the first amplifier 11 through a first contact of the switch SW1 and to the noninverting input terminal of the second amplifier 12 through a second contact of the SW2. The second shunt resistor voltage input terminal −IN of the IC 6 is connected to the other end of the shunt resistor 2 through a resistor on the one hand. On the other hand, the terminal −IN is connected to the noninverting input terminal of the second amplifier 12 through a second contact of the switch SW1 and to the noninverting input terminal of the first amplifier 11 through a first contact of the SW2.

A capacitor and a series circuit of two other capacitors are connected in parallel with the shunt resistor 2. The junction between the two series-connected capacitors is grounded.

The current measuring circuit 10 includes resistors R1 to R4 that are connected in series with one another, one end of the resistor R1 being grounded. The inverting input terminal and output terminal of the first amplifier 11 are connected individually to the opposite ends of the resistor R2, while the inverting input terminal and output terminal of the second amplifier 12 are connected individually to the opposite ends of the resistor R4.

The switches SW1 and SW2 of the polarity inversion switch means 14 are turned on or off (for polarity inversion) in accordance with the logical data that represent the charging and discharging states of the secondary battery 1. When one of the switches is in an on-position, the other switch is in an off-position. When the switches SW1 and SW2 are on and off, respectively, the first voltage input terminal +IN is connected with the first amplifier 11 and the second voltage input terminal −IN is connected with the second amplifier 12. On the contrary, when the switches SW1 and SW2 are off and on, respectively, the first voltage input terminal +IN is connected with the second amplifier 12 and the second voltage input terminal −IN is connected with the first amplifier 11.

As a result that the polarity inversion switch means 14 performs the aforesaid polarity inversion operation depending on the operating state, charging or discharging, of the secondary battery 1, the voltage across the resistor 2 is applied to the input side of an instrumentation differential amplifier, comprised of the first to third operational amplifiers 11 to 13 and having a specified operating polarity, in the same polarity suited to the operating polarity of the differential amplifier, irrespective of whether the secondary battery 1 is in either one of the charging and discharging states in which electric current flows in different directions through the shunt resistor 2 (or in which the voltage across the resistor 2 has different polarities).

The first operational amplifier 11 which functions as an input buffer amplifier with a gain of 1 or more cooperates with the second operational amplifier 12 to constitute a differential amplifier circuit that measures the voltage across the shunt resistor 2. In other words, the second operational amplifier 12 is supplied at its one input terminal with the one terminal voltage +IN or −IN of the shunt resistor 2 through the first operational amplifier 11 and is supplied at its another input terminal with the other terminal voltage −IN or +IN of the resistor 2, to thereby measure the voltage across the resistor 2. The third operational amplifier 13 is provided in an output stage of the differential amplifier circuit, and functions as an output buffer amplifier that, in conjunction with a second switch group 18 (described in detail later), variably sets the gain of the differential amplifier circuit. These three operational amplifiers 11, 12 and 13 constitute an instrumentation differential amplifier with variable gain and high input impedance.

The current measuring circuit 10 is provided with a first switch group 15 comprised of switches SW3 to SW7, an offset power source 17 for generating a reference offset voltage of, e.g., 1.25 V, and connecting terminals REF, IREF1, IREF2 and IREF3. In association with these current measuring circuit elements, a resistor group 16 comprised of series-connected resistors R10 to R13 is externally attached to the IC 6. One end of the resistor R10 is connected to a reference offset voltage output terminal of the offset power source 17 through the connecting terminal REF, one end of the resistor R13 is grounded, and the junctions between the resistors R10 to R13 are connected to the respective one ends of the switches SW3, SW4 and SW5 through the connecting terminals IREF3, IREF2 and IREF3, respectively. The respective other ends of the switches SW3, SW4 and SW5 are connected to the noninverting input terminal of the second amplifier 12. The switch SW6 is interposed between the respective noninverting input terminals of the first and second operational amplifiers 11 and 12, while the switch SW7 is interposed between the noninverting input terminal of the first operational amplifier 11 and the ground.

The switches SW3, SW4 and SW5, which constitute part of the first switch group, are turned on or off in accordance with that logical data which represents the offset condition associated with the application of an offset voltage to the operational amplifier 12, out of the logical data applied to the logical data input terminals SEL0 to SEL4 of the current measuring circuit 10 under the control of the microprocessor 5. Thus, all of the switches SW3, SW4 and SW5 are turned off or any one of them is turned on, to thereby apply the reference offset voltage or its divisions to the noninverting input terminal of the second amplifier 12. In consequence, an offset voltage is applied between the respective noninverting input terminals of the first and second operational amplifiers 11 and 12, whereby the differential amplification characteristic is set off.

The switch SW6 is turned on in accordance with that logical data which represents a short-circuit command, out of the logical data applied to the logical data input terminals SEL0 to SEL4, whereupon the respective noninverting input terminals of the first and second operational amplifiers 11 and 12 are short-circuited. The switch SW7 is turned on in accordance with that logical data which represents a grounding command, whereupon the noninverting input terminal of the first operational amplifier 11 is grounded. The voltage across the shunt resistor to be applied to the operational amplifiers 11 and 12 can be artificially reduced to zero by turning on the switch SW6, while the noninverting input terminal of the amplifier 11 can be grounded by turning on the switch SW7. An output current value delivered from the operational amplifier 13 in either state can be used for the offset voltage and gain adjustment.

The current measuring circuit 10 is provided with the second switch group 18 including switches SW8 to SW11, a second resistor group 19 including series-connected resistors R5 to R8, the charging/discharging current signal output terminal IOUT connected to the output terminal of the third operational amplifier 13 and the A/D converter 5a of the microprocessor 5, and a test terminal TEST1 connected to the output terminal of the second operational amplifier 12. The test terminal TEST1 may be omitted. The output terminal of the second operational amplifier 12 is connected to the noninverting input terminal of the third operational amplifier 13. The inverting input terminal of the third amplifier 13 is connected to the respective one sides of the switches SW8 to SW11. The other side of the switch SW8 is connected to the output terminal of the third amplifier 13 and one end of the resistor R8, the respective other sides of the switches SW9, SW10 and SW11 are connected individually to the junctions between the resistors R8, R7, R6 and R5, and one end of the resistor R5 is grounded.

The switches SW8 to SW11 are turned on or off in accordance with that logical data which represents the gain condition associated with the gain of the operational amplifier 13, out of the logical data applied to the logical data input terminals SEL0 to SEL4 of the current measuring circuit 10 under the control of the microprocessor 5. Thus, any one of the switches SW8 to SW11 is turned on so that one of the feedback resistors R5 to R8 is interposed between the output terminal and inverting input terminal of the operational amplifier 13, to thereby variably set the gain of the third operational amplifier 13 as well as the overall gain of the instrumentation differential amplifier.

According to the current measuring circuit 10 constructed in this manner, the instrumentation differential amplifier, which determines the charging and discharging currents of the secondary battery 1 by measuring the voltage across the shunt resistor 2, is comprised of the three operational amplifiers 11, 12 and 13 each of which is driven by a single polarity power source, and its input impedance is set high enough. The polarity inversion switch means 14 is shifted in accordance with the direction of current that varies depending on the mode, charge or discharge, of the secondary battery 1, in order to conform to the operating polarity of the differential amplifier. By doing this, the voltage across the shunt resistor 2 is applied to the instrumentation differential amplifier in the same polarity irrespective of whether the secondary battery 1 is in the charging or discharging state.

With this circuit configuration, the charging and discharging currents can be measured even with use of the instrumentation differential amplifier which is driven by a single power source and is operable in a restricted single polarity zone. This eliminates the use of positive and negative power sources. Accordingly, the differential amplifier and its drive power source can be simplified in construction, and the power consumption of the amplifier can be restrained. Besides, all the circuit elements of the differential amplifier, especially the first and second operational amplifiers 11 and 12, are formed together as part of the IC 6 during the manufacture of the IC 6. Manufacturing errors of the circuit elements of the differential amplifier, which are attributable to manufacturing errors in IC manufacturing processes, are substantially on the same level. Accordingly, variations in the operating characteristics of the circuit elements of the differential amplifier are less than in the case where a differential amplifier is constructed by discrete circuit components that are manufactured separately. Thus, the operating characteristics of the differential amplifier associated with the measurement of the charging and discharging currents based on the voltage across the shunt resistor can be enhanced as a whole, and the relative measurement errors of the differential amplifier corresponding to the variations in the characteristics of the circuit elements are small. Owing to the manufacturing errors in the IC manufacturing process, however, the operating characteristics of the differential amplifier that is formed as part of the IC 6 generally cannot be intended ones in a strict sense. Therefore, a measured current value delivered from the differential amplifier to which the voltage across the shunt resistor is applied cannot be completely identical with the value of the charging or discharging current flowing through the resistor. In other words, the absolute measurement accuracy of the differential amplifier is not satisfactory in some cases.

According to this current measuring circuit 10, on the other hand, the offset voltage can be selectively applied to the differential amplifier and variably set by means of the second switch group 15 and the offset power source 17. Besides, the gain of the differential amplifier can be variably set by means of the second switch group 18. Further, the absolute measurement accuracy of the differential amplifier can be improved by simple calibration based on the adjustment of the offset voltage and gain.

More specifically, the input voltage-output current characteristics of the current measuring circuit 10 can be determined by measuring the voltage across the shunt resistor 2, which is generated when a predetermined current is caused to flow through the resistor 2, and by measuring the value of the output current delivered from the circuit 10 to which the voltage across the shunt resistor is applied, while varying the value of the predetermined current supplied to the resistor 2. The switches of the first and second switch groups 15 and 18 are shifted in order to obtain intended input-output characteristics such that the value of the current supplied to the shunt resistor 2 is equal to or exactly corresponds to the value of the output current from the current measuring circuit 10. By doing this, the offset voltage to be applied to the differential amplifier of the circuit 10 and the gain of the differential amplifier can be set suitably.

By calibrating the operating characteristics of the instrumentation differential amplifier in this manner, the absolute measurement accuracy of the current measuring circuit 10 can be improved satisfactorily. As a result of combined effects of the improved absolute measurement accuracy and the relative measurement accuracy of the differential amplifier which is high enough, the charging and discharging currents of the secondary battery 1 can be measured with high accuracy and stability. Further, the calibration of the operating characteristics of the differential amplifier based on the adjustment of the offset voltage and gain can be carried out relatively easily. Since additional calibration is unnecessary if the working environment of the battery pack is substantially fixed, no relevant load is imposed on the microprocessor 5. Normally, those logical data which represent the offset and gain conditions, out of the logical data supplied from the logical data distribution circuit 60 to the current measuring circuit 10 via the terminals SEL0 to SEL4 can be set in advance, and those control data from the microprocessor 5 which correspond to these logical data can be set previously. According to the current measuring circuit 10 calibrated in this manner and enjoying the measurement accuracy high enough, the remaining battery capacity of the secondary battery 1 can be determined highly accurately in accordance with the charging and discharging currents that are measured with high accuracy, despite the simple construction and moderate price of the microprocessor 5.

The following is an additional description of the calibration of the input-output characteristics of the current measuring circuit 10 based on the offset voltage and gain adjustment. In the case where the input-output characteristics of the circuit 10 have, over the entirety of the variable range of the voltage (input voltage to the circuit 10) across the shunt resistor, linearity good enough to ensure satisfactory absolute measurement accuracy, the same offset voltage and the same gain can be set throughout the variable range of the voltage. In the case where the input-output characteristics of the current measuring circuit 10 are not linear enough, on the other hand, the entire variable range of the output current of the circuit 10, which represents the voltage across the shunt resistor, is previously divided into a plurality of regions, and offset voltages and gains (control data) suitable for these individual current regions are set in advance, for example. Then, the control data to be delivered from the microprocessor 5 may be changed in accordance with the measured current value supplied from the circuit 10 to the microprocessor 5.

Figure 4:
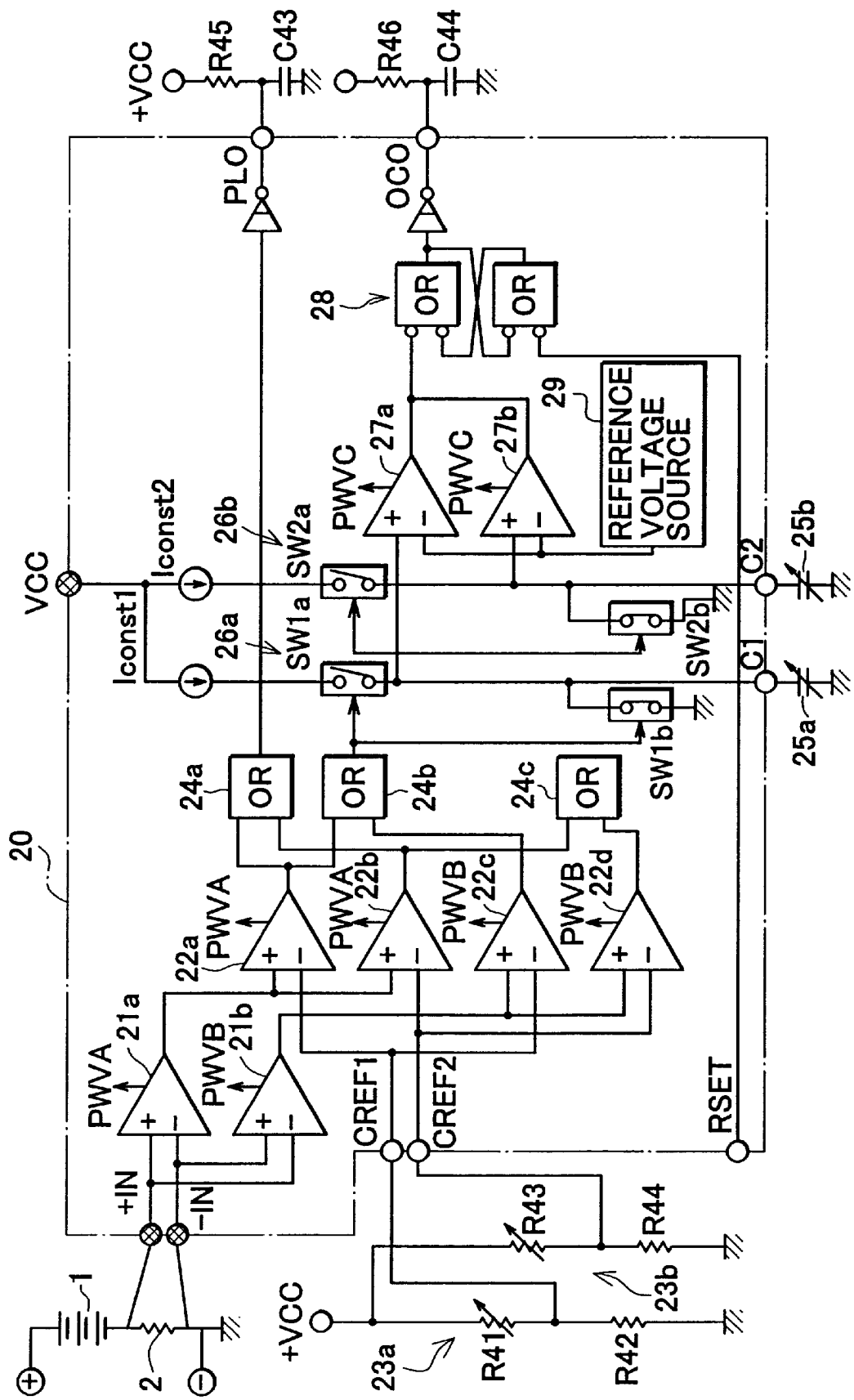
FIG. 4 is a diagram showing an exemplary configuration of an overcurrent detection circuit shown in FIG. 2.

Referring now to FIG. 4, the overcurrent detection circuit 20 will be described.

The overcurrent detection circuit 20 is similar to the current measuring circuit 10 in that it detects the current flowing through the shunt resistor 2 in accordance with the voltage across the shunt resistor. However, it differs from the circuit 10, which detects the normal charging and discharging currents in the secondary battery 1, in that it detects overcurrent in the battery 1. Thus, the overcurrent detection circuit 20 and the current measuring circuit 10 are arranged independently of each other.

The overcurrent detection circuit 20 is provided with two differential amplifiers 21a and 21b, which are arranged in parallel with each other in an input stage of the circuit 20 and serve individually to detect excessive charging and discharging currents. The differential amplifiers 21a and 21b, like the operational amplifiers 11, 12 and 13 in the current measuring circuit 10, are each driven by a single power source and their operative range (polarity) is restricted. Accordingly, the voltage across the shunt resistor is applied to the amplifiers 21a and 21b in different polarity. More specifically, the differential amplifier 21a has noninverting and inverting input terminals respectively connected to the first and second shunt resistor voltage input terminals +IN and −IN, and is designed to detect the charging current of the secondary battery 1. On the other hand, the differential amplifier 21b has inverting and noninverting input terminals that are connected to the terminals +IN and −IN, respectively, and is designed to detect the discharging current of the secondary battery 1.

Thus, in the overcurrent detection circuit 20, the two differential amplifiers 21a and 21b are arranged in parallel with each other in place of the provision of the polarity inversion switch means 14. Accordingly, the generation of overcurrent during the charge or discharge of the secondary battery 1 can be detected securely and quickly without entailing a time loss attributable to the shift of the switches.

In association with the adjustment of the overcurrent detection level of the overcurrent detection circuit 20, the remaining battery capacity measuring device comprises first and second external resistors 23a and 23b. The first external resistor 23a is comprised of a variable resistor R41 having one end thereof connected to the power supply terminal VCC and a fixed resistor R42 connected in series with the resistor R41 and having one end thereof grounded. The resistor 23a is used to set a first overcurrent detection level. Likewise, the second external resistor 23b is comprised of variable and fixed resistors R43 and R44, and is used to set a second overcurrent detection level. In the present embodiment, the first and second detection levels are set so that the former is higher than the latter. The overcurrent detection circuit 20 has a first reference voltage input terminal CREF1 connected to the junction between the resistors R41 and R42 and a second reference voltage input terminal CREF2 connected to the junction between the resistors R43 and R44.

The output terminal of the differential amplifier 21a is connected to the respective noninverting input terminals of first and second comparators 22a and 22b that are arranged in parallel with each other. The respective inverting input terminals of the comparators 22a and 22b are connected to the first and second reference voltage input terminals CREF1 and CREF2, respectively. The output terminal of the differential amplifier 21b is connected to the respective noninverting input terminals of third and fourth comparators 22c and 22d, and the respective inverting input terminals of the comparators 22c and 22d are connected to the reference voltage input terminals CREF1 and CREF2, respectively.

The voltage across the shunt resistor detected by the differential amplifier 21a and representative of the charging current flowing through the shunt resistor 2 is applied to the first and second comparators 22a and 22b arranged in parallel with each other and is compared with each of first and second reference values CREF1 and CREF2. Further, the voltage across the shunt resistor detected by the other differential amplifier 21b is applied to the third and fourth comparators 22c and 22d that are arranged in parallel with each other, and is compared with each of first and second reference values.

Each of the first and third comparators 22a and 22c generates an overcurrent detection signal when the first overcurrent detection level CREF1 is exceeded by the current value that is detected by its corresponding differential amplifier 21a or 21b. Each of the second and fourth comparators 22b and 22d generates an overcurrent detection signal when the second overcurrent detection level CREF2 is exceeded by the detected current value. In other words, the charging current of the secondary battery 1 detected by the differential amplifier 21a is compared with the first and second reference values CREF1 and CREF2 in the first and second comparators 22a and 22b. On the other hand, the discharging current of the secondary battery 1 detected by the differential amplifier 21b is compared with the first and second reference values CREF1 and CREF2 in the third and fourth comparators 22c and 22d.

The overcurrent detection circuit 20 includes an OR circuit 24a having two input terminals that are connected individually to the respective output terminals of the first and second comparators 22a and 22b. Overcurrent detection outputs, associated with the charging mode, of the first and second comparators 22a and 22b are delivered from the OR circuit 24a to the microprocessor 5 through a buffer and the overcurrent detection output terminal PLO of the IC 6 at the time when they are detected. In FIG. 4, symbol R45 and C43 designate a resistor and a capacitor, respectively, which constitute a load equivalent to an input stage of the microprocessor 5.

Further, the overcurrent detection circuit 20 includes OR circuits 24b and 24c. Two input terminals of the OR circuit 24b are connected individually to the respective output terminals of the first and third comparators 22a and 22c, while two input terminals of the OR circuit 24c are connected individually to the respective output terminals of the second and fourth comparators 22b and 22d. In the OR circuit 24b, therefore, the logical sum of the respective detection outputs of the first and third comparators 21a and 21c, which individually indicate the generation of excessive charging and discharging currents that exceed the first reference value CREF1, is obtained. In the OR circuit 24c, the logical sum of the respective detection outputs of the second and fourth comparators 21b and 21d, which individually indicate the generation of excessive charging and discharging currents that exceed the second reference value CREF2 smaller than the first reference value CREF1, is obtained.

When overcurrent is detected, the OR circuits 24b and 24c respectively activate timer circuits 26a and 26b in two systems that utilize the charging characteristics of capacitors 25a and 25b externally attached to the IC 6.

The timer circuit 26a is comprised of a constant-current source Iconst1 connected to the power supply terminal VCC of the IC 6, an external capacitor 25a connected to the source Iconst1 through a capacitor connecting terminal C1 of the IC 6 and chargeable with the output current of the source Iconst1, switches SW1a and SW1b responsive to the output of the OR circuit 24b, and an auxiliary comparator 27a for comparing the charging voltage of the capacitor 25a and a given voltage. The switch SW1a, which is interposed between the constant-current source Iconst1 and the connecting terminal C1, is turned on to connect the source Iconst1 and the external capacitor 25a in response to the output of the OR circuit 24b. The switch SW1b interposed between the connecting terminal C1 and the ground is turned on to short-circuit the ends of the capacitor 25a, thereby discharging the capacitor 25a, when the output of the OR circuit 24b is extinguished. The auxiliary comparator 27a has its noninverting input terminal connected to the capacitor 25a through the connecting terminal C1 and its inverting input terminal connected to a reference voltage source 29 that generates a reference voltage of, e.g., 1.25 V. Likewise, the timer circuit 26a is comprised of a constant-current source Iconst2, an external capacitor 25b, switches SW2a and SW2b, and an auxiliary comparator 27b.

The OR circuits 24b and 24c cause the constant-current sources Iconst1 and Iconst2 to start charging the capacitors 25a and 25b, respectively, by selectively activating the switch groups SW1a, SW2a; SW1b, SW2b of the timer circuits 26a and 26b. The auxiliary comparators 27a and 27b compare the respective charging voltages of the thus charged capacitors 25a and 25b with the reference voltage, and deliver outputs indicative of the generation of overcurrent when the reference voltage is reached by the charging voltages. Thus, the comparators 27a and 27b serve to delay the delivery of the outputs of the OR circuits 24b and 24c until the reference voltage is reached by the charging voltages of the capacitors 25a and 25b. The delay times of the timer circuits 26a and 26b can be adjusted by varying the respective capacities of the external variable capacitors 25a and 25b.

The respective output terminals of the auxiliary comparators 27a and 27b are connected to one input terminal of a first OR circuit of a latch circuit 28, and the output terminal of the first OR circuit is connected to one input terminal of a second OR circuit of the latch circuit 28. The output terminal of the second OR circuit is connected to the other input terminal of the first OR circuit, and the other input terminal of the second OR circuit is connected to a reset signal input terminal of the IC 6. Thus, the two OR circuits of the latch circuit 28 are cross-coupled to each other.

The respective outputs of the first, second, third, and fourth comparators 22a, 22b, 22c and 22d, which are delayed by the timer circuits 26a and 26b, are applied to the microprocessor and the driver circuit 40 through the latch circuit 28, a buffer, 5 and the overcurrent detection signal output terminal OCO of the IC 6. In FIG. 4, an input stage of the driver circuit 40 and the microprocessor 5 is shown as an equivalent load that is comprised of a resistor R46 and a capacitor C44.

In the overcurrent detection circuit 20 constructed in the manner described above, the charging and discharging currents of the secondary battery 1 are measured independently by means of the differential amplifiers 21a and 21b in two systems. The two measured current values are compared independently by means of the comparators 22a, 22b; 22c, 22d with the first and second overcurrent detection levels CREF1 and CREF2 that are set by adjusting the external resistors 23a and 23b, whereupon overcurrent is detected. The results of the overcurrent detection are delayed for a given time and outputted through the timer circuits 26a and 26b whose delay times are variably set by adjusting the respective capacities of the capacitors 25a and 25b.

Thus, although the primary part of the overcurrent detection circuit 20 is configured in the integrated circuit form, as part of the IC 6, the overcurrent detection level can be variably set by adjusting the external resistors 23a and 23b, while the response time for the overcurrent detection can be variably set by adjusting the capacitors 25a and 25b. In consequence, the circuit 20 is universalized so that protection against overcurrent can be suitably provided depending on the specifications, properties, and intended use of the secondary battery 1.

In the overcurrent detection circuit 20, the detection system (differential amplifier 21a and first and second comparators 22a and 22b) for detecting overcurrent while the secondary battery 1 is being charged and the detection system (differential amplifier 21b and third and fourth comparators 22c and 22d) for detecting overcurrent while the battery 1 is being discharged are arranged independently of each other, and electric power is selectively supplied to these systems. This selective power supply is controlled by means of a power switch circuit 50, which will be mentioned later. In consequence, only one of the two detection systems can be driven at a time, so that the power consumption is substantially halved. This alternative power supply, in particular, is executed in association with the drive of the switch driver (driver circuit) 40 under the control of the microprocessor 5, so that the power supply can be immediately changed without delaying behind the changeover between charge and discharge of the secondary battery 1.

According to the overcurrent detection circuit 20 constructed in this manner, its input stage is comprised of the differential amplifiers 21a and 21b with high input impedance, and its entire circuit configuration is designed for lower power consumption. Accordingly, the circuit 20 is suited to be configured in the integrated circuit form as part of the IC 6. Since the two differential amplifiers 21a and 21b and the four comparators 22a, 22b, 22c and 22d can be formed on the same device element or substrate, variations of their operating characteristics can be restrained to secure stable operation as a whole. Since the external components include only the resistors 23a and 23b for setting the overcurrent detection level and the capacitors 25a and 25b for the detection response time adjustment, they can be easily adjusted to meet the specifications and the mode of use of the secondary battery 1.

Figure 5:
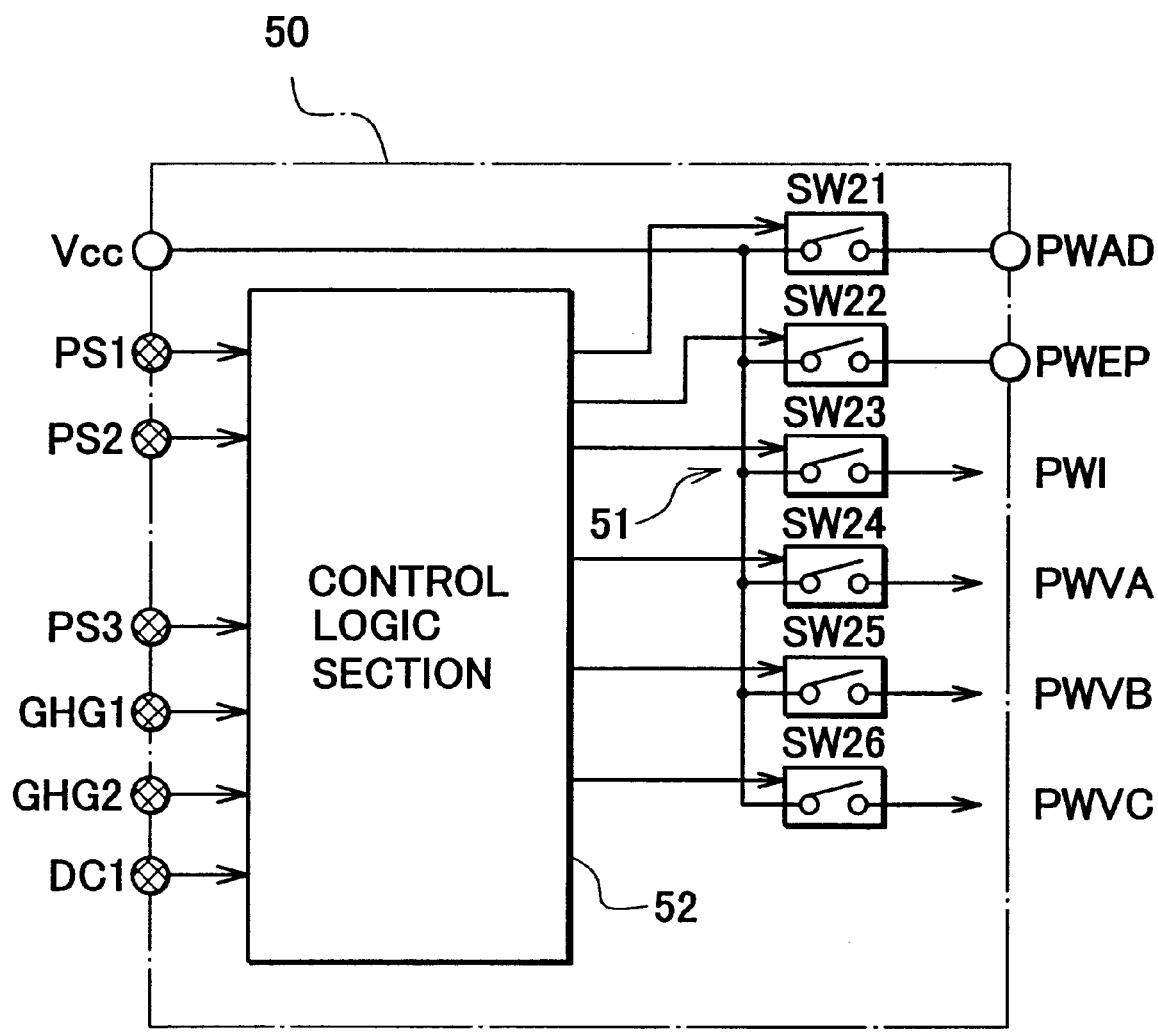
FIG. 5 is a diagram showing an exemplary configuration of a power switch circuit shown in FIG. 2.

Referring now to FIG. 5, the power switch circuit 50 will be described.

The power switch circuit 50 serves to reduce the power consumption by selectively carrying out electric power supply to the current measuring circuit 10, the two overcurrent detection systems in the overcurrent detection circuit 20, the voltage measuring circuit 30, the A/D converter 5a attached to the microprocessor 5, and a memory EEPROM.

The power switch circuit 50 is provided with a power switch group 51 including switches SW21 to SW26, a control logic section 52 for separately turning on and off the switches SW21 to SW26, control signal input terminals PS1 to PS3, and charging and discharging state signal input terminals CHG1, CHG2 and DC1.

The respective input sides of the switches SW21 to SW26 are connected to the power supply terminal VCC of the IC 6. The respective output sides of the SW21 and SW22 are connected to a reference voltage input terminal of the A/D converter 5a and the driving voltage input terminal of the memory EEPROM, respectively. The output side of the switch SW23 is connected to the operational amplifiers 11 to 13 of the current measuring circuit 10, the offset power source 17, and the driving voltage input terminal of the voltage measuring circuit 30. The memory EEPROM serves to store measurement data to be used for the calibration of the operating characteristics of the current measuring circuit 10, state information of the microprocessor 5, etc. The switches SW24 to SW26 are associated with the overcurrent detection circuit 20. The output side of the switch SW24 is connected to the respective driving voltage input terminals of the differential amplifier 21a and the comparators 22a and 22b. The output side of the switch SW25 is connected to the respective driving voltage input terminals of the differential amplifier 21b and the comparators 22c and 22d. The output side of the switch SW26 is connected to the respective driving voltage input terminals of the auxiliary comparators 27a and 27b.

The control logic section 52 opens or closes the switches SW21 to SW26 in response to control signals PS1 to PS3 generated in the logical data distribution circuit 60 in accordance with the control data from the microprocessor 5, charging state signals CHG1 and CHG2 supplied from the driver circuit 40 and indicative of the conduction of the trickle-charge FET and the quick-charge FET, and a discharging state signal DC1 supplied from the driver circuit 40 and indicative of the conduction of the discharge FET, thereby controlling the supply of power to the circuit elements 10, 20, 30 and 5a and the memory EEPROM. In association with the power supply control for the individual parts of the overcurrent detection circuit 20, FIG. 6 illustrates, by way of example, the relations between the control signal PS3 from the microprocessor 5 and the charging and discharging state signals CHG1, CHG2 and DC1 and the open and closed states of the switches SW24 to SW26. In FIG. 2, symbols PS1, A and B individually designate logical data that are associated with the voltage measuring operation of the voltage measuring circuit 30 and supplied from the logical data distribution circuit 60 to the circuit 30.

When the switch SW21 is closed in the power switch circuit 50 constructed in this manner, a reference voltage PWAD for A/D conversion is supplied to the A/D converter 5a of the microprocessor 5. When the switch SW22 is closed, a driving voltage PWEP is supplied to the memory EEPROM of the microprocessor 5. When the switch SW23 is closed, a driving voltage PWI is supplied to the current measuring circuit 10 and the voltage measuring circuit 30.

When the switch SW24 is closed, moreover, a driving voltage PWVA is applied to the differential amplifier 21a and the first and second comparators 22a and 22b that constitute the charging current detection system. When the switch SW25 is closed, a driving voltage PWVB is applied to the differential amplifier 21b and the third and fourth comparators 22c and 22d that constitute the discharging current detection system. The open-close operation of the switches SW24 and SW25 is carried out depending on the operating state, charging or discharging, of the secondary battery 1, whereby selective supply of the driving voltages PWVA and PWVB is controlled. More specifically, when the secondary battery 1 is charged, the driving voltage PWVA is supplied only to the differential amplifier 21a and the first and second comparators 22a and 22c, and the supply of the driving voltage PWVB to the differential amplifier 21b and the third and fourth comparators 22c and 22d is stopped. By doing this, useless operation on the side of the differential amplifier 21b can be interrupted to avoid waste of power consumption. Likewise, when the secondary battery 1 is discharged, the driving voltage PWVB is supplied only to the side of the differential amplifier 21b, and the supply of the driving voltage PWVA to the side of the differential amplifier 21a is stopped. By doing this, useless operation on the side of the differential amplifier 21a can be interrupted to avoid waste of power consumption.

When the switch SW26 is then closed, a driving voltage PWVC is applied to the comparators 27a and 27b incorporated in the timer circuits that are arranged subsequently to the comparators 22a, 22b, 22c and 22d.

The comparators 27a and 27b incorporated in the timer circuits can fulfill their functions even if they are operated only during the time the timer circuits operate in response to the outputs of the comparators 22a, 22c; 22b, 22d. Therefore, the power switch circuit 50 may be constructed so that the driving voltage PWVC can be applied to the comparators 27a and 27b only when actuation signals for the timer circuits (outputs of the comparators 22a, 22c; 22b, 22d) are delivered. In this case, it is necessary only that the respective outputs of the comparators 22a, 22b, 22c and 22d be delivered into the control logic section 52.

As described above, the power switch circuit 50 selectively actuates the individual circuit function sections of the remaining battery capacity measuring device by selectively activating, under the control of the control logic section 52, the switches of the power switch group 51 through which electric power is supplied to the circuit function sections. In other words, waste of power consumption is avoided by stopping the power supply to those circuit function sections which need not be actuated. In this manner, the remaining battery capacity measuring device, especially the entire IC 6, is given power-saving properties. For instance, especially in a power-saving mode or the like, the power supply to the circuit function sections including the microprocessor 5 is stopped after the operating state of the microprocessor 5 is loaded into the memory EEPROM. Under these conditions, the power consumption of the secondary battery 1 can be minimized.

Thus, in the overcurrent detection circuit 20, the selective power supply to the differential amplifiers 21a and 21b and the comparators 22a, 22b, 22c and 22d is carried out, depending on the operating state, charging or discharging, of the secondary battery 1, under the control of the power switch circuit 50, and the comparators 27a and 27b are actuated only when overcurrent is detected. Therefore, drive of circuit elements whose functions are temporarily unnecessary can be interrupted, so that the power consumption can be lowered substantially.

According to the IC 6 provided with the current measuring circuit 10, overcurrent detection circuit 20, and power switch circuit 50, etc. constructed in the above manner, the individual circuit function sections are power-saving, and the differential amplifiers for detecting the charging and discharging currents of the secondary battery 1 from the voltage across the shunt resistor 2 enjoy high input impedance and high accuracy. Accordingly, the operating state of the secondary battery 1 can be securely detected and monitored. In the current measuring circuit 10, in particular, its absolute measurement accuracy can be set to be high enough by applying an offset to the differential amplifiers and adjusting the gain, so that, in combination of the relative measurement accuracy which is sufficiently high, the charging and discharging currents of the secondary battery 1 can be measured highly accurately. In consequence, the remaining battery capacity measurement based on the cumulative processing of measured currents in the microprocessor 5 can be carried out with ease and high accuracy.

In the overcurrent detection circuit 20, moreover, the level and response time for the overcurrent detection can be individually variably set. In this embodiment, especially, the overcurrent detection level and detection response time can be set in two stages each, so that an optimum protective measure can be taken against overcurrent, depending on the specifications and intended use of the secondary battery 1.

According to the IC 6 constructed as described above, the overall power consumption is restrained, and heat generation from the individual circuit function sections can be minimized by the power-saving function. Accordingly, the IC 6, along with the microprocessor 5 and the like, is suitable to be packaged together with the secondary battery 1 to form a battery pack. In realizing the battery pack, in particular, the current measuring circuit 10, overcurrent detection circuit 20, etc. are received together with the secondary battery 1 in a closed container, so that they are expected to be small-sized, low-priced, low in heat release, and highly safe. Thus, according to the IC 6 with the integrated circuit function sections, those requirements can be fulfilled with effect, so that the battery pack can be formed easily and effectively.

Since the current measuring circuit 10 and the overcurrent detection circuit 20 independently measure and detect the charging and discharging currents of the secondary battery 1 from the voltage across the shunt resistor 2, the dynamic range of the circuit 10 need not be set to be unusefully wide. Since it is necessary only that the dynamic range of the differential amplifiers in the current measuring circuit 10 be settled depending on the ordinary or steady-state levels of the charging and discharging currents of the secondary battery 1, in particular, the measurement accuracy of the circuit 10 can be made high enough.

The present invention is not limited to the embodiment described above.

The remaining battery capacity measuring device according to the foregoing embodiment has the following four features. Firstly, the current measuring circuit 10 has the offset voltage-gain adjustment function. Secondly, the current measuring circuit 10 and the overcurrent detection circuit 20 independently detect the voltage across the shunt resistor. Thirdly, the overcurrent detection circuit 20 can externally set the overcurrent detection level and overcurrent detection response time. Fourthly, the power switch circuit 50 is used to make the device power-saving. The present invention is not limited to this arrangement, and the device may be modified so that it has at least one of the four features described above.

Figure 7:
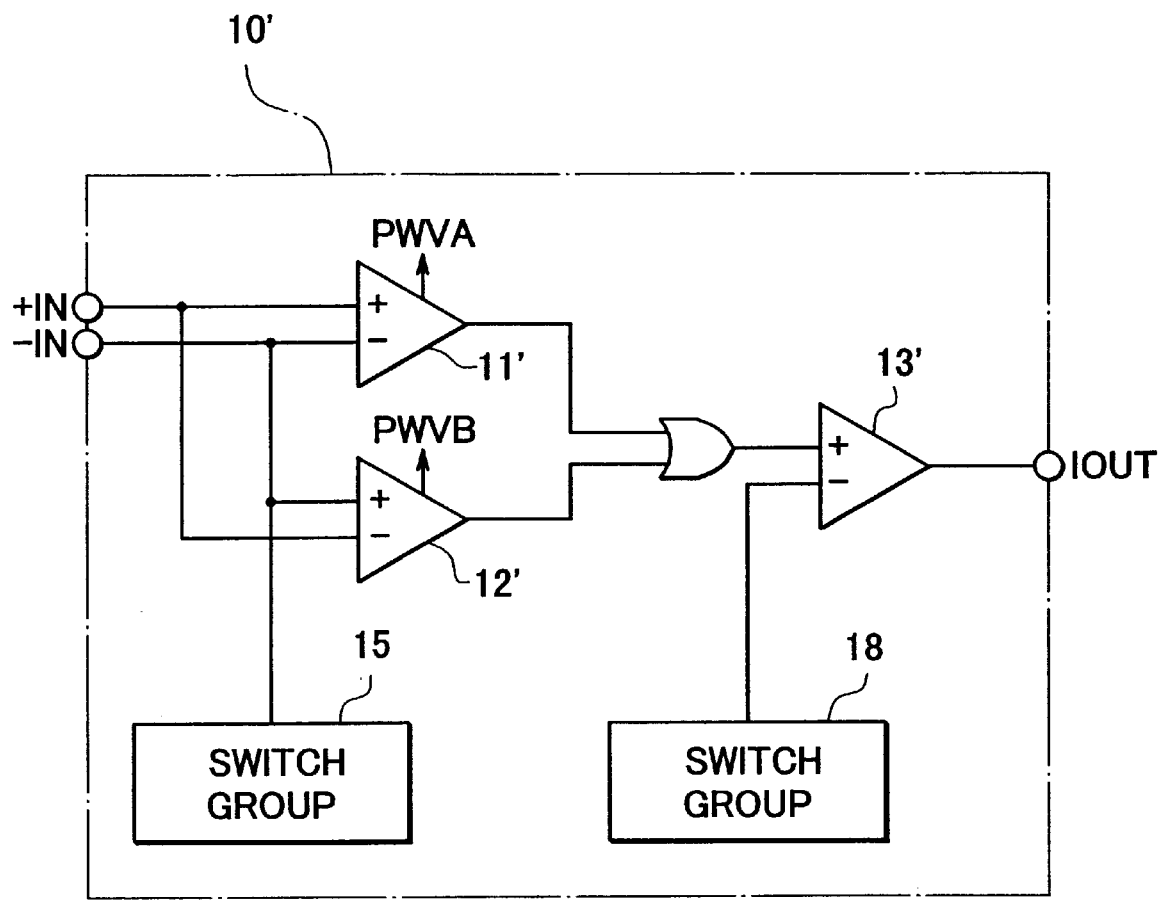
FIG. 7 is a schematic block diagram showing a current measuring circuit according to a modification of the invention.

In the current measuring circuit 10 according to the foregoing embodiment, the polarity inversion switch means 14 is provided so that the voltage across the shunt resistor can be inputted with the same polarity without regard to the operating state, charging or discharging, of the secondary battery. As in the case of the overcurrent detection circuit 20, however, differential amplifiers in two systems for independently measuring the charging and discharging currents of the secondary battery may be used in place of the polarity inversion switch means 14. FIG. 7 shows a current measuring circuit 10' according to this modification. One shunt resistor voltage input terminal +IN is connected to the noninverting input terminal of a differential amplifier 11' and the inverting input terminal of a differential amplifier 12'. The other shunt resistor voltage input terminal −IN is connected to the inverting input terminal of the differential amplifier 11', the noninverting input terminal of the differential amplifier 12', and the switch group 15. The respective output terminals of the differential amplifiers 11' and 12' are connected to the noninverting input terminal of an amplifier 13' through an OR circuit, while the inverting input terminal and output terminal of the amplifier 13' are connected to the switch group 18 and the charging/discharging current signal output terminal IOUT, respectively. Depending on the operating state, charging or discharging, of the secondary battery 1, power supply PWVA to the differential amplifier 11' or power supply PWVB to the differential amplifier 12' is selectively effected under the control of the power switch circuit 50.

According to the foregoing embodiment, as shown in FIGS. 1 and 2, the IC is formed lumping together all the peripheral analog circuits of the secondary battery 1 except the overvoltage protection circuit 7 with a substantially different operating voltage and the microprocessor that operates digitally. Alternatively, only specific circuit function sections may be put together into an IC. In the IC 6 shown in FIG. 3, the circuit function sections are mounted so that they can be received in a 64-pin standard package. However, they need not always be arranged just in this manner.

Further, the current measuring circuit 10 may be designed so that the level of the offset voltage applied to each differential amplifier is set more minutely, and the gain can be adjusted more finely. It is to be understood that the overcurrent detection level and detection response time for the overcurrent detection circuit 20 may be set for one or three or more systems each.

Furthermore, the circuit function for effecting the selective power supply under the control of the power switch circuit 50 to restrain waste of power consumption must only be settled according to the specifications.

Various changes and modifications may be effected in the present invention by one skilled in the art without departing from the scope or spirit of the invention.

What is claimed is:

1. A remaining battery capacity measuring device comprising:
   a current measuring circuit for measuring charging and discharging currents of a secondary battery, said current measuring circuit including:
   a differential amplifier circuit for detecting a voltage across a resistor for current detection connected in series with the secondary battery,
   an offset voltage regulator circuit for selectively applying an offset voltage to the differential amplifier circuit and for variably setting the offset voltage, and
   a gain adjusting circuit for variably setting a gain of the differential amplifier circuit.

2. The remaining battery capacity measuring device according to claim 1, wherein said current measuring circuit further includes a polarity inversion switch circuit interposed between the resistor and the differential amplifier circuit,
   the polarity inversion switch circuit changes input polarity of the voltage across the resistor, the voltage being input to the differential amplifier circuit in the input polarity,
   said differential amplifier circuit is driven by a single power source, and
   said polarity inversion switch circuit takes a first shift position when the secondary battery is charged and takes a second shift position when the secondary battery is discharged, the input polarity in the second shift position being opposite to that in the first shift position.

3. The remaining battery capacity measuring device according to claim 1, further comprising:

an overcurrent detection circuit for detecting the voltage across the resistor independently of the current measuring circuit and for detecting overcurrent in the secondary battery in accordance with the detected voltage across the resistor.

4. The remaining battery capacity measuring device according to claim 3, wherein each of said current measuring circuit and said overcurrent detection circuit has an input stage comprised of a differential amplifier with high input impedance.

5. The remaining battery capacity measuring device according to claim 4, wherein said current measuring circuit and said overcurrent detection circuit are configured in an integrated circuit form.

6. The remaining battery capacity measuring device according to claim 1, further comprising:
   an overcurrent detection circuit for detecting overcurrent in the secondary battery;
   wherein the overcurrent detection circuit includes a differential amplifier for detecting the voltage across the resistor for current detection connected in series with the secondary battery, a comparator for comparing an externally set reference value with an output of the differential amplifier and for outputting an output signal indicative of generation of overcurrent when the reference value is exceeded by the output of the differential amplifier, and a timer circuit for starting time measurement in response to an output signal of the comparator and for outputting an overcurrent detection signal when an externally set time is over.

7. The remaining battery capacity measuring device according to claim 6, wherein said overcurrent detection circuit includes first and second differential amplifiers each driven by a single power source, and
   each of the first and second differential amplifiers is connected with opposite ends of the resistor so as to input the voltage across the resistor in polarity which is different between the first and second differential amplifiers.

8. The remaining battery capacity measuring device according to claim 7, wherein said first differential amplifier has a noninverting input terminal connected to one end of the resistor and an inverting input terminal connected to another end of the resistor, and
   said second differential amplifier has an inverting input terminal connected to the one end of the resistor and a noninverting input terminal connected to said another end of the resistor.

9. The remaining battery capacity measuring device according to claim 7, wherein a corresponding one of said first and second differential amplifiers is driven depending on whether the secondary battery is charged or discharged.

10. The remaining battery capacity measuring device according to claim 6, wherein said comparator of said overcurrent detection circuit has an input terminal connected to the differential amplifier and an input terminal connected to a voltage divider circuit comprised of a resistor externally attached to the overcurrent detection circuit.

11. The remaining battery capacity measuring device according to claim 10, wherein said voltage divider circuit includes a variable resistor.

12. The remaining battery capacity measuring device according to claim 6, wherein said timer circuit includes a switch circuit responsive to the output signal of the comparator, a constant-current source connected through the switch circuit to a capacitor, externally attached to the overcurrent detection circuit, for charging the capacitor, and an auxiliary comparator for comparing a charging voltage to which the capacitor is charged with a reference voltage and for outputting the overcurrent detection signal when the reference voltage is exceeded by the charging voltage of the capacitor.

13. The remaining battery capacity measuring device according to claim 12, wherein said capacitor is a variable capacitor.

14. The remaining battery capacity measuring device according to claim 1, wherein said current measuring circuit includes first and second differential amplifiers each connected to opposite ends of the resistor for current detection, connected in series with the secondary battery, so as to input the voltage across the resistor in polarity different between the first and second differential amplifiers, each of the first and second differential amplifiers detecting an electric current flowing through the secondary battery based on the voltage across the resistor, and said remaining battery capacity measuring device further comprises a power switch circuit for selectively connecting the first or second differential amplifier to a power source, depending on the direction of the electric current flowing through the secondary battery.

15. The remaining battery capacity measuring device according to claim 1, further comprising:

an overcurrent detection circuit for detecting overcurrent in the secondary battery in accordance with the voltage across the resistor, the overcurrent detection circuit including first and second differential amplifiers each connected with opposite ends of the resistor so as to input the applied voltage across the resistor in polarity which is different between the first and second differential amplifiers, each of the first and second differential amplifiers detecting an electric current flowing through the secondary battery from the voltage across the resistor; and a power switch circuit for selectively connecting the first or second differential amplifier to a power source, depending on the direction of the electric current flowing through the secondary battery.

16. The remaining battery capacity measuring device according to claim 15, wherein said first differential amplifier has a noninverting input terminal connected to one end of the resistor for current detection and an inverting input terminal connected to another end of the resistor, and said second differential amplifier has an inverting input terminal connected to the one end of the resistor for current detection and a noninverting input terminal connected to said another end of the resistor.

17. The remaining battery capacity measuring device according to claim 15, wherein said first and second differential amplifiers are each driven by a single power source.

18. The remaining battery capacity measuring device according to claim 15, wherein said overcurrent detection circuit further includes a first comparator for comparing an output of the first differential amplifier with a first reference value and for outputting a first discrimination output when the first reference value is exceeded by the output of the first differential amplifier, and a second comparator for comparing an output of the second differential amplifier with a second reference value and for outputting a second discrimination output when the second reference value is exceeded by the output of the second differential amplifier; and said power switch circuit connects a corresponding one of the first and second comparators to the power source, depending on which of the first and second differential amplifiers is connected to the power source through the power switch circuit.

19. The remaining battery capacity measuring device according to claim 18, wherein said overcurrent detection circuit further includes a first overcurrent detector for detecting overcurrent in accordance with the first discrimination output from the first comparator, and a second overcurrent detector for detecting overcurrent in accordance with the second discrimination output from the second comparator; and said power switch circuit connects the first overcurrent detector to the power source when the first discrimination output is delivered and connects the second overcurrent detector to the power source when the second discrimination output is delivered.

20. A remaining battery capacity measuring device, comprising:

a current measuring circuit for detecting a voltage across a resistor for current detection connected in series with a secondary battery and for measuring charging and discharging currents of the secondary battery in accordance with the voltage across the resistor; and an overcurrent detection circuit for detecting the voltage across the resistor independently of said current measuring circuit and for detecting overcurrent in the secondary battery in accordance with the detected voltage across the resistor.

21. The remaining battery capacity measuring device according to claim 20, wherein each of said current measuring circuit and said overcurrent detection circuit has an input stage comprised of a differential amplifier with high input impedance.

22. The remaining battery capacity measuring device according to claim 21, wherein said current measuring circuit and said overcurrent detection circuit are configured in an integrated circuit form.

23. The remaining battery capacity measuring device according to claim 20, wherein said overcurrent detection circuit includes a differential amplifier for detecting the voltage across the resistor for current detection connected in series with the secondary battery, a comparator for comparing an externally set reference value with an output of said differential amplifier and for outputting an output signal indicative of generation of overcurrent when the reference value is exceeded by the output of the differential amplifier, and a timer circuit for starting time measurement in response to an output signal of the comparator and for outputting an overcurrent detection signal when an externally set time is over.

24. The remaining battery capacity measuring device according to claim 20, wherein said current measuring circuit includes first and second differential amplifiers each connected to opposite ends of the resistor for current detection, connected in series with the secondary battery, so as to input the voltage across the resistor in polarity different between the first and second differential amplifiers, each of the first and second differential amplifiers detecting an electric current flowing through the secondary battery based on the voltage across the resistor, and said remaining battery capacity measuring device further comprises a power switch circuit for selectively connecting the first or second differential amplifier to a power source, depending on the direction of the electric current flowing through the secondary battery.

25. The remaining battery capacity measuring device according to claim 20, wherein said overcurrent detection circuit includes first and second differential amplifiers each connected to opposite ends of the resistor for current detection so as to input the voltage across the resistor in polarity different between the first and second differential amplifiers, each of the first and second differential amplifiers detecting an electric current flowing through the secondary battery based on the voltage across the resistor, and said remaining battery capacity measuring device further comprises a power switch circuit for selectively connecting the first or second differential amplifier to a power source, depending on the direction of the electric current flowing through the secondary battery.

26. A remaining battery capacity measuring device, comprising:

an overcurrent detection circuit for detecting overcurrent in a secondary battery, said overcurrent detection circuit including:

a differential amplifier for detecting a voltage across a resistor for current detection connected in series with the secondary battery;

a comparator for comparing an externally set reference value with an output of the differential amplifier and for outputting an output signal indicative of the generation of overcurrent when the reference value is exceeded by the output of the differential amplifier; and a timer circuit for starting time measurement in response to an output signal of the comparator and for outputting an overcurrent detection signal when an externally set time is over.

27. The remaining battery capacity measuring device according to claim 26, wherein said overcurrent detection circuit includes first and second differential amplifiers each driven by a single power source, and each of the first and second differential amplifiers is connected with opposite ends of the resistor so as to input the voltage across the resistor in polarity which is different between the first and second differential amplifiers.

28. The remaining battery capacity measuring device according to claim 27, wherein said first differential amplifier has a noninverting input terminal connected to one end of the resistor and an inverting input terminal connected to another end of the resistor, and said second differential amplifier has an inverting input terminal connected to the one end of the resistor and a noninverting input terminal connected to said another end of the resistor.

29. The remaining battery capacity measuring device according to claim 27, wherein a corresponding one of said first and second differential amplifiers is driven depending on whether the secondary battery is charged or discharged.

30. The remaining battery capacity measuring device according to claim 26, wherein said comparator of said overcurrent detection circuit has an input terminal connected to the differential amplifier and an input terminal connected to a voltage divider circuit comprised of a resistor externally attached to the overcurrent detection circuit.

31. The remaining battery capacity measuring device according to claim 30, wherein said voltage divider circuit includes a variable resistor.

32. The remaining battery capacity measuring device according to claim 26, wherein said timer circuit includes a switch circuit responsive to the output signal of the comparator, a constant-current source connected through the switch circuit to a capacitor, externally attached to the overcurrent detection circuit, for charging the capacitor, and an auxiliary comparator for comparing a charging voltage to which the capacitor is charged with a reference voltage and for outputting the overcurrent detection signal when the reference voltage is exceeded by the charging voltage of the capacitor.

33. The remaining battery capacity measuring device according to claim 32, wherein said capacitor is a variable capacitor.

34. The remaining battery capacity measuring device according to claim 26, further comprising:

a current measuring circuit for detecting the voltage across the resistor independently of the overcurrent detecting circuit and for detecting charging and discharging currents of the secondary battery in accordance with the detected voltage across the resistor.

35. The remaining battery capacity measuring device according to claim 26, further comprising:

a current measuring circuit for detecting charging and discharging currents of the secondary battery, said current measuring circuit including first and second differential amplifiers each connected to opposite ends of the resistor for current detection, connected in series with the secondary battery, so as to input the voltage across the resistor in polarity different between the first and second differential amplifiers, each of the first and second differential amplifiers detecting an electric current flowing through the secondary battery based on the voltage across the resistor, and a power switch circuit for selectively connecting the first or second differential amplifier to a power source, depending on the direction of the electric current flowing through the secondary battery.

36. The remaining battery capacity measuring device according to claim 26, wherein said overcurrent detection circuit includes first and second differential amplifiers each connected with opposite ends of the resistor so as to input the applied voltage across the resistor in polarity which is different between the first and second differential amplifiers, each of the first and second differential amplifiers detecting an electric current flowing through the secondary battery from the voltage across the resistor, and the remaining battery capacity measuring device further comprises a power switch circuit for selectively connecting the first or second differential amplifier to a power source, depending on the direction of the electric current flowing through the secondary battery.

37. A remaining battery capacity measuring device, comprising:

a current detection circuit including first and second differential amplifiers each connected to opposite ends of a resistor for current detection, connected in series with a secondary battery, so as to input the voltage across the resistor in polarity different between the first and second differential amplifiers, each of the first and second differential amplifiers detecting an electric current flowing through the secondary battery based on the voltage across the resistor; and a power switch circuit for selectively connecting the first or second differential amplifier to a power source, depending on the direction of the electric current flowing through the secondary battery.

38. The remaining battery capacity measuring device according to claim 37, wherein said first differential amplifier has a noninverting input terminal connected to one end of the resistor for current detection and an inverting input terminal connected to another end of the resistor, and said second differential amplifier has an inverting input terminal connected to the one end of the resistor for current detection and a noninverting input terminal connected to said another end of the resistor.

39. The remaining battery capacity measuring device according to claim 38, wherein said first and second differential amplifiers are each driven by a single power source.

40. The remaining battery capacity measuring device according to claim 37, wherein said current detection circuit is a current measuring circuit for detecting the charging and discharging currents of the secondary battery in accordance with the voltage across the resistor for current detection, and a corresponding one of the first and second differential amplifiers is connected to the power source through the power switch circuit, depending on whether the secondary battery is charged or discharged.

41. The remaining battery capacity measuring device according to claim 37, wherein said current detection circuit is an overcurrent detection circuit for detecting overcurrent in the secondary battery in accordance with the voltage across the resistor for current detection.

42. The remaining battery capacity measuring device according to claim 41, wherein said current detection circuit constituting the overcurrent detection circuit further includes a first comparator for comparing an output of the first differential amplifier with a first reference value and for outputting a first discrimination output when the first reference value is exceeded by the output of the first differential amplifier, and a second comparator for comparing an output of the second differential amplifier with a second reference value and for outputting a second discrimination output when the second reference value is exceeded by the output of the second differential amplifier, and said power switch circuit connects a corresponding one of the first and second comparators to the power source, depending on which of the first and second differential amplifiers is connected to the power source through the power switch circuit.

43. The remaining battery capacity measuring device according to claim 42, wherein said current detection circuit constituting the overcurrent detection circuit further includes a first overcurrent detector for detecting overcurrent in accordance with the first discrimination output from the first comparator and a second overcurrent detector for detecting overcurrent in accordance with the second discrimination output from the second comparator, and said power switch circuit connects the first overcurrent detector to the power source when the first discrimination output is delivered and connects the second overcurrent detector to the power source when the second discrimination output is delivered.

44. The remaining battery capacity measuring device according to claim 40, further comprising:

an overcurrent detection circuit for detecting the voltage across the resistor independently of the current measuring circuit and for detecting overcurrent in the secondary battery in accordance with the detected voltage across the resistor.

45. The remaining battery capacity measuring device according to claim 44, wherein said overcurrent detection circuit includes a differential amplifier for detecting the voltage across the resistor for current detection connected in series with the secondary battery, a comparator for comparing an externally set reference value with an output of the differential amplifier and for outputting an output signal indicative of generation of overcurrent when the reference value is exceeded by the output of the differential amplifier, and a timer circuit for starting time measurement in response to an output signal of the comparator and for outputting an overcurrent detection signal when an externally set time is over.

46. The remaining battery capacity measuring device according to claim 41, further comprising:

a current measuring circuit for detecting the voltage across the resistor independently of the overcurrent detecting circuit and for detecting charging and discharging currents of the secondary battery in accordance with the detected voltage across the resistor.

47. The remaining battery capacity measuring device according to claim 46, wherein said overcurrent detection circuit includes a differential amplifier for detecting the voltage across the resistor for current detection connected in series with the secondary battery, a comparator for comparing an externally set reference value with an output of the differential amplifier and for outputting an output signal indicative of generation of overcurrent when the reference value is exceeded by the output of the differential amplifier, and a timer circuit for starting time measurement in response to an output signal of the comparator and for outputting an overcurrent detection signal when an externally set time is over.

* * * * *